(12) United States Patent
Kim et al.

(10) Patent No.: US 8,415,659 B2
(45) Date of Patent: Apr. 9, 2013

(54) ORGANIC LIGHT EMITTING DIODE DISPLAY DEVICE AND METHOD OF FABRICATING THE SAME

(75) Inventors: Sung-Ho Kim, Yongin (KR); Il-Jeong Lee, Yongin (KR); Do-Hyun Kwon, Yongin (KR); Choong-Youl Im, Yongin (KR); Hee-Seong Jeong, Yongin (KR); Su-Mi Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 289 days.

(21) Appl. No.: 12/822,838

(22) Filed: Jun. 24, 2010

(65) Prior Publication Data

US 2011/0001139 A1    Jan. 6, 2011

(30) Foreign Application Priority Data

Jul. 3, 2009    (KR) .................. 10-2009-0060851

(51) Int. Cl.
*H01L 29/08*    (2006.01)
*H01L 35/24*    (2006.01)
*H01L 51/00*    (2006.01)

(52) U.S. Cl.
USPC .......... 257/40; 257/59; 257/72; 257/E51.005; 257/E51.006; 257/E51.018

(58) Field of Classification Search .............. 257/59, 257/72, 40, E51.005, E51.006, E51.018
See application file for complete search history.

(56) References Cited

U.S. PATENT DOCUMENTS

| | | |
|---|---|---|
| 2005/0189874 A1 | 9/2005 | Park et al. |
| 2005/0285197 A1 | 12/2005 | Park |
| 2005/0285516 A1 | 12/2005 | Godo et al. |
| 2006/0220542 A1 | 10/2006 | Suh et al. |
| 2007/0002198 A1 | 1/2007 | Yang et al. |
| 2008/0284326 A1 | 11/2008 | Choi et al. |
| 2008/0308821 A1 | 12/2008 | Hsu |
| 2009/0101911 A1* | 4/2009 | Kim et al. .................. 257/66 |
| 2010/0133526 A1* | 6/2010 | Yang ........................ 257/40 |
| 2010/0187522 A1* | 7/2010 | Lee et al. .................. 257/40 |
| 2011/0159625 A1* | 6/2011 | Kitamura et al. .......... 438/46 |

(Continued)

FOREIGN PATENT DOCUMENTS

| | | |
|---|---|---|
| CN | 1681365 A | 10/2005 |
| JP | 2002221936 | 8/2002 |

(Continued)

*Primary Examiner* — Victor A Mandala
(74) *Attorney, Agent, or Firm* — Robert E. Bushnell, Esq

(57) ABSTRACT

An organic light emitting diode (OLED) display device and a method of fabricating the same. The OLED display device includes a substrate including an emission region and a non-emission region, a buffer layer arranged on the substrate, a semiconductor layer arranged in the non-emission region on the buffer layer, a gate insulating layer arranged on an entire surface of the substrate, a first electrode arranged in the emission region on the gate insulating layer, a gate electrode arranged in the non-emission region on the gate insulating layer, an interlayer insulating layer arranged on the entire surface of the substrate and partially exposing the first electrode, source and drain electrodes arranged on the interlayer insulating layer and electrically connected to the semiconductor layer and the first electrode, a protection layer arranged on the entire surface of the substrate and partially exposing the first electrode, an organic layer arranged on the first electrode and a second electrode arranged on the entire surface of the substrate.

28 Claims, 13 Drawing Sheets

U.S. PATENT DOCUMENTS

2011/0193070 A1* 8/2011 Yamazaki et al. ............... 257/40
2011/0227075 A1* 9/2011 Stainer et al. .................... 257/57
2011/0315970 A1* 12/2011 Yokoyama et al. ............. 257/40

FOREIGN PATENT DOCUMENTS

| | | |
|---|---|---|
| JP | 2002293687 | 10/2002 |
| JP | 2004272193 A | 9/2004 |
| JP | 2006054425 | 2/2006 |
| JP | 2006106076 | 4/2006 |
| JP | 2006216539 A | 8/2006 |
| JP | 2008165170 A | 7/2008 |
| KR | 10-2005-0079733 | 8/2005 |
| KR | 10-2005-0105852 | 11/2005 |
| KR | 10-2006-0028251 | 3/2006 |
| KR | 100601370 B1 | 7/2006 |
| KR | 10-2007-0034769 | 3/2007 |

* cited by examiner

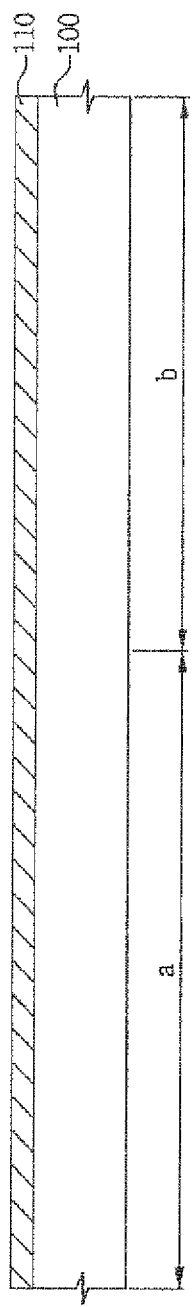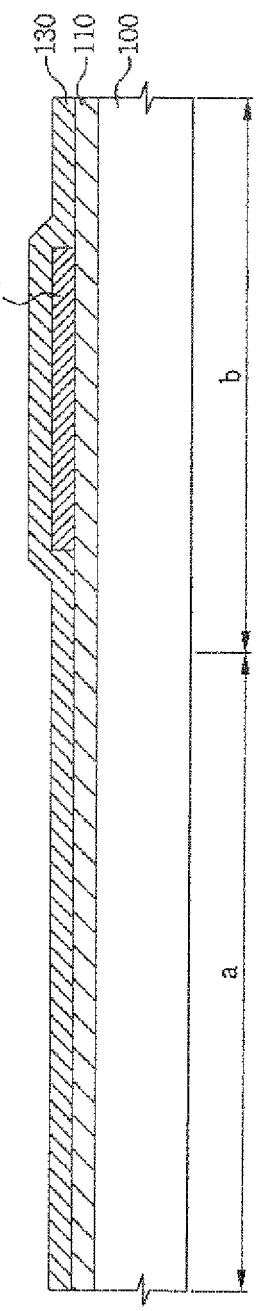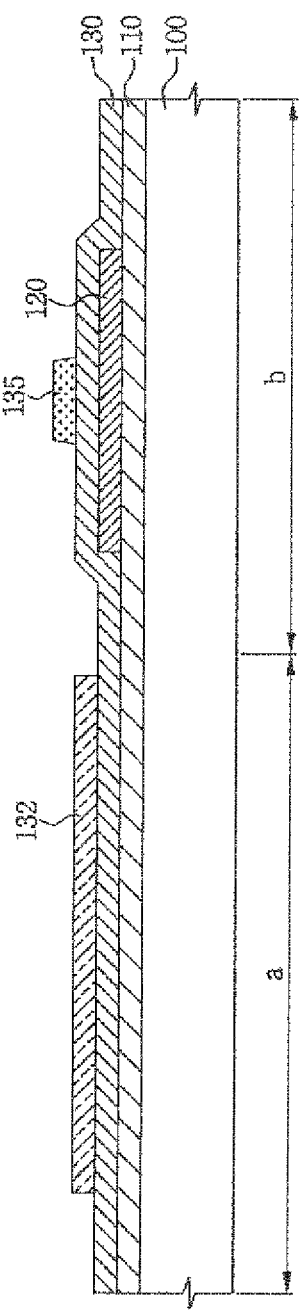

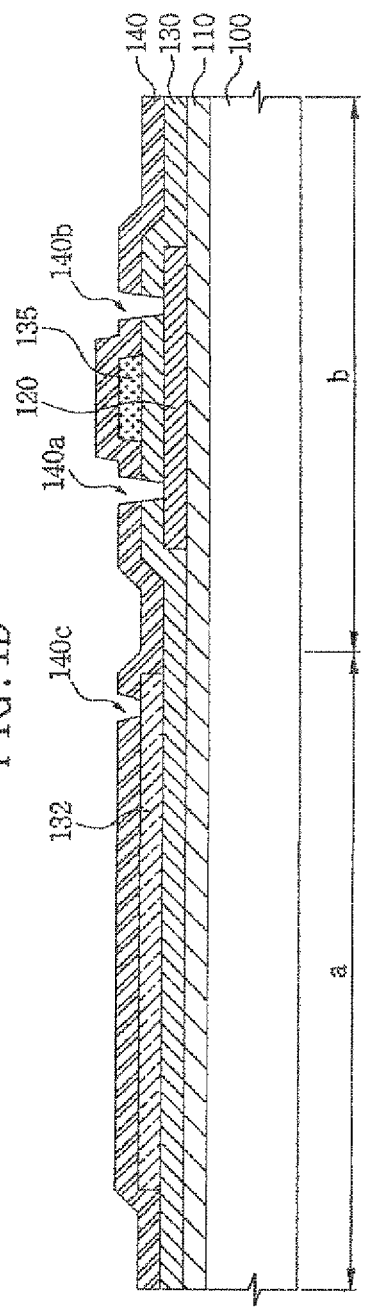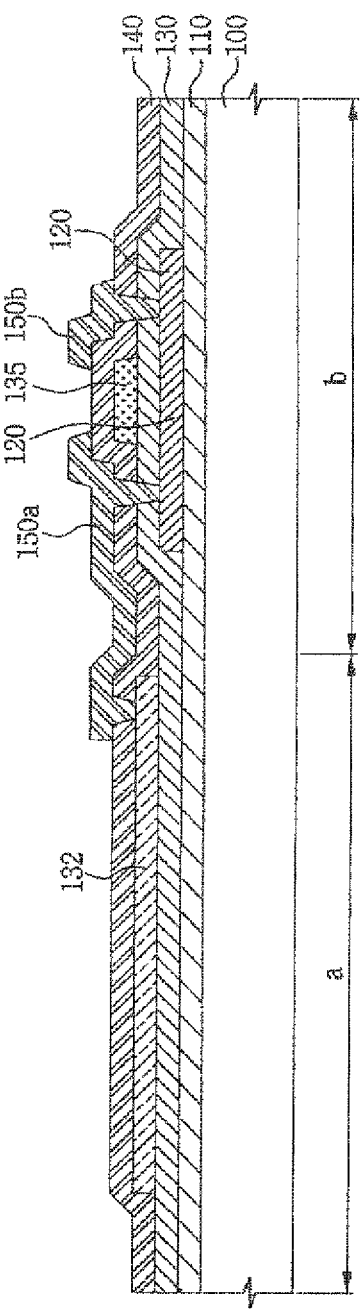

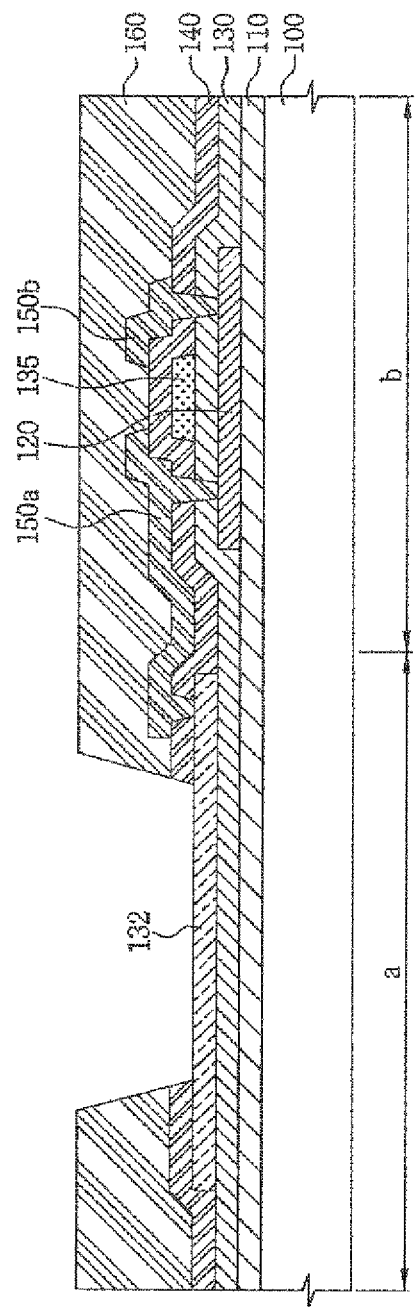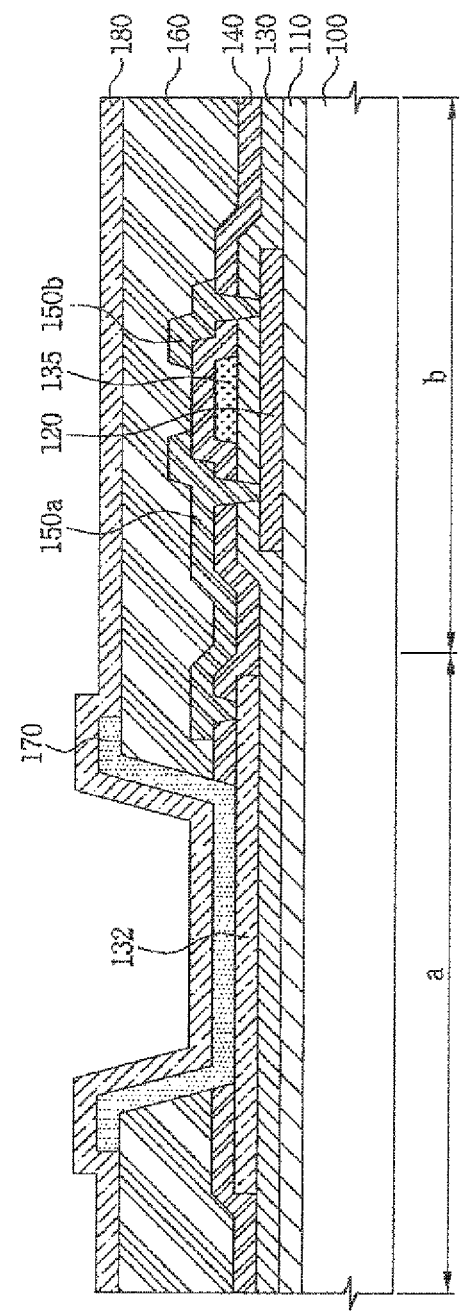

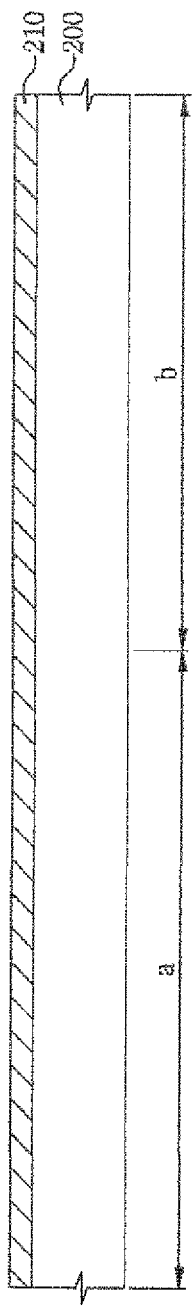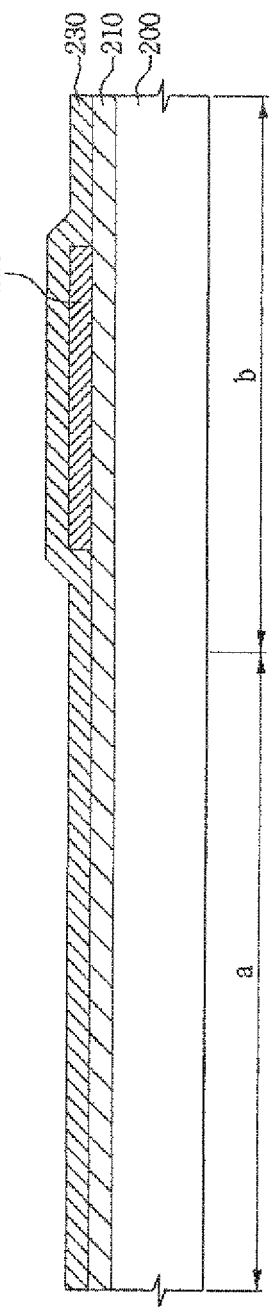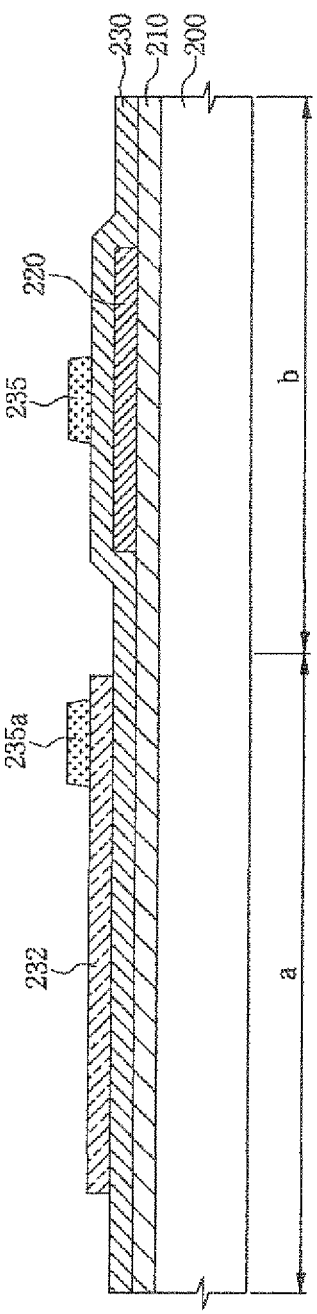

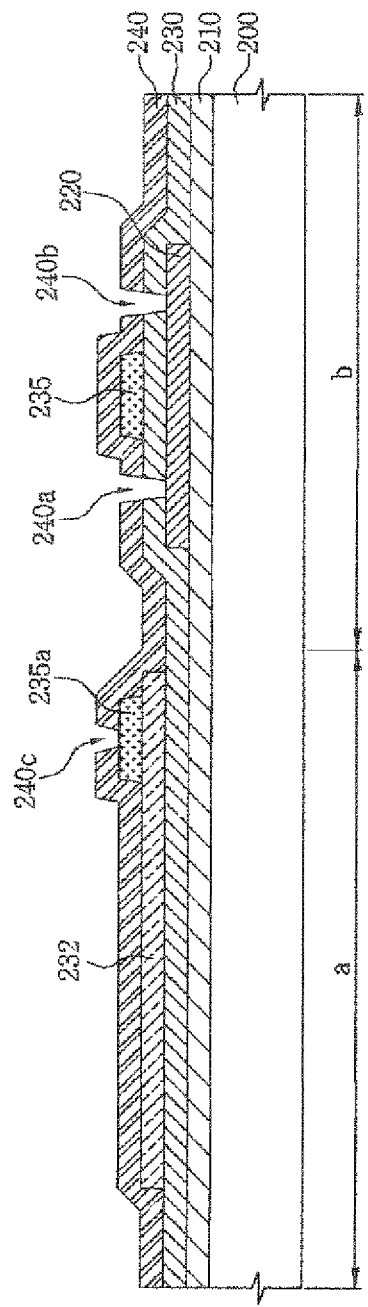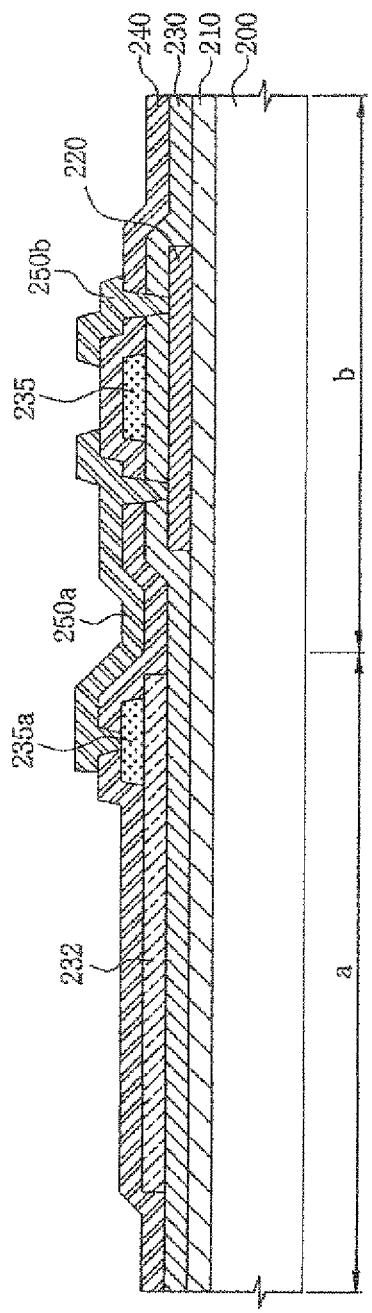

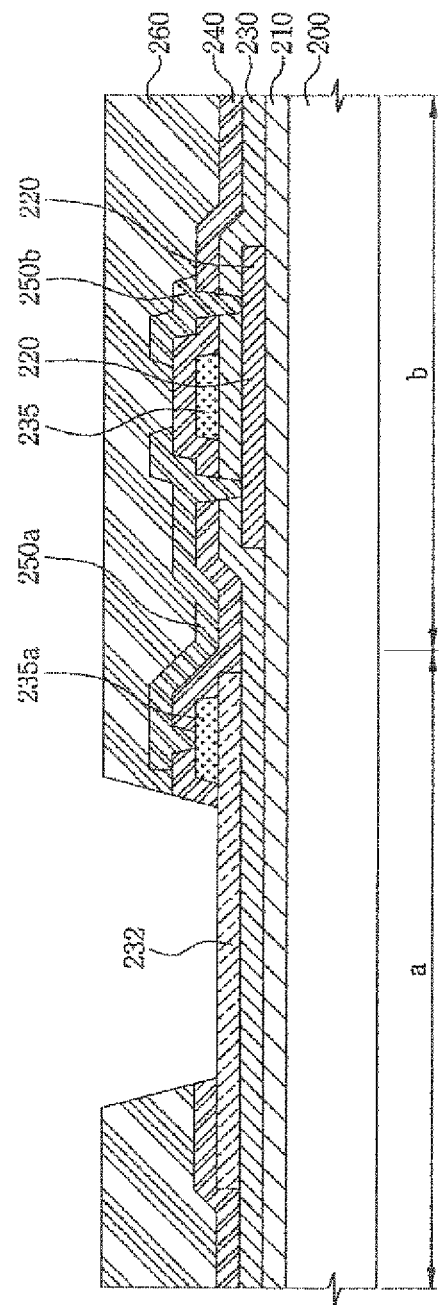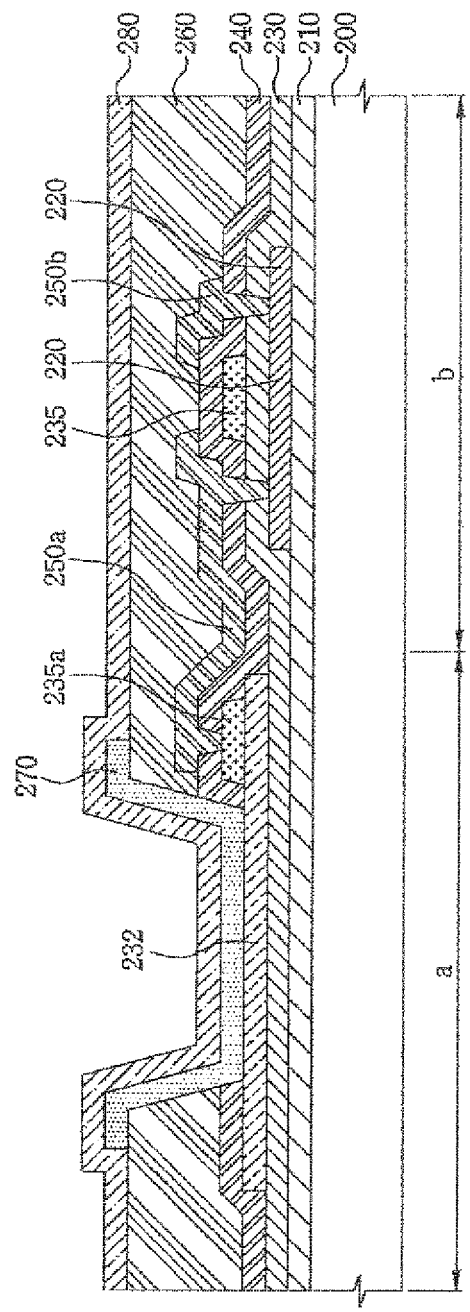

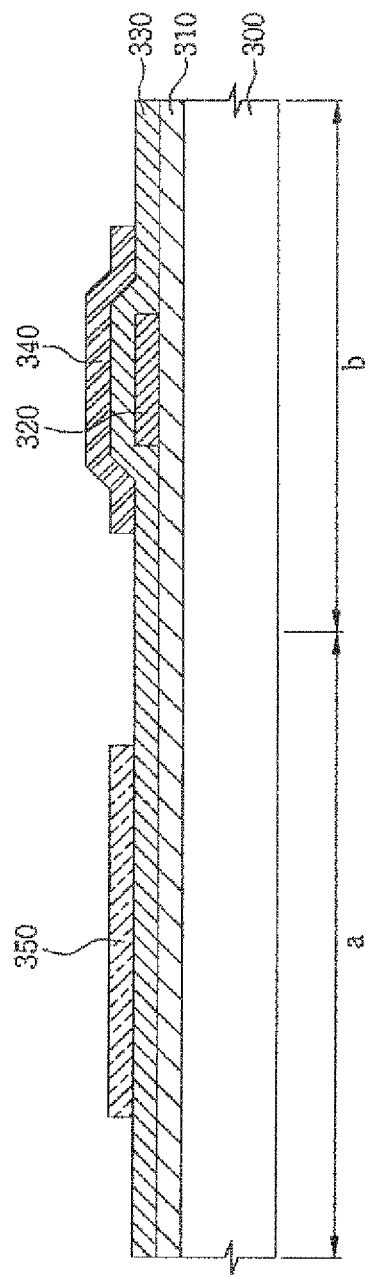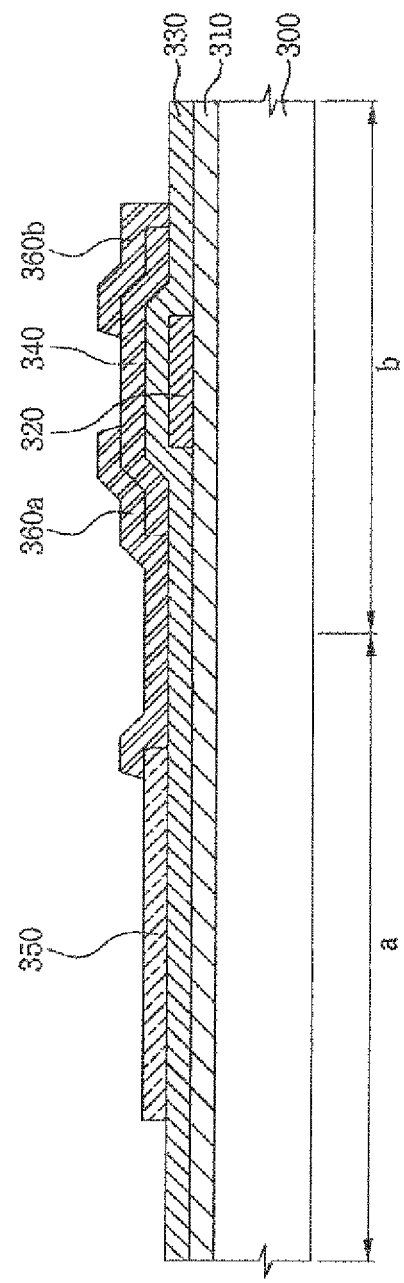

ORGANIC LIGHT EMITTING DIODE DISPLAY DEVICE AND METHOD OF FABRICATING THE SAME

CLAIM OF PRIORITY

This application makes reference to, incorporates the same herein, and claims all benefits accruing under 35 U.S.C. §119 from an application earlier filed in the Korean Intellectual Property Office on Jul. 3, 2009 and there duly assigned Serial No. 10-2009-0060851.

BACKGROUND OF THE INVENTION

1. Field of the Invention

The present invention relates to an OLED display device and a method of manufacturing the same, the display that can maximize a resonance effect during an emission operation, thereby increasing luminous efficiency and color reproduction during a bottom emission operation.

2. Description of the Related Art

In general, an organic light emitting diode (OLED) display device can operate on the following principle. Electrons are injected from an electron injection electrode (or cathode) into an emission layer (EML), while holes are injected from a hole injection electrode (or anode) into the EML. The holes and electrons injected into the EML recombine in the EML to generate excitons. Thus, while the excitons are making the transition from an excited state to a ground state, the OLED display device can emit light. Based on the above-described principle and unlike a conventional liquid crystal display (LCD), the OLED display device requires no additional light source thereby reducing the volume and weight of a display device.

OLED display devices can be classified into a passive matrix (PM) type and an active matrix (AM) type depending on how the N×M pixels, which are arranged in a matrix shape, are driven. Although a PM OLED display device is configured using a simple fabrication process, the PM OLED display device can consume a lot of power and have technical limitations in implementing large-scaled display. Also, the PM OLED display device can have a lower aperture ratio and an increased number of interconnections.

In another aspect, OLED display devices can be categorized as a top-emitting type or a bottom-emitting type depending on a direction in which light is emitted from an organic EML. A bottom-emitting type OLED display device, which emits light toward a substrate, can adopt a reflective electrode or reflective layer together with a transparent electrode as an upper electrode and a transparent electrode as the lower electrode. In the case of an AM OLED display device using a thin film transistor (TFT), since light can not be transmitted through a portion where the TFT is located, the area of an emission unit can be reduced. In contrast, a top-emitting OLED display device, which emits light in a direction away from the substrate, can have a transparent electrode as an upper electrode and a reflective electrode and a transparent electrode as the lower electrode. Thus, an area through which light is transmitted can be increased, thereby improving the luminance of the OLED display device. Nowadays, more attention is being paid to a double-sided OLED display device capable of embodying a top-emitting type and a bottom-emitting type on a single substrate.

However, although a conventional OLED display device can be employed without any problem in a top-emitting mode, transmittance degradation due to an organic layer can preclude obtaining a high-quality image in a bottom-emitting mode.

SUMMARY OF THE INVENTION

The present invention provides an organic light emitting diode (OLED) display device which can maximize a resonance effect during an emission operation, thereby increasing luminous efficiency and color reproduction during a bottom or double-sided emission operation, and a method of fabricating the OLED display device.

According to an aspect of the present invention, there is provided an organic light emitting diode (OLED) display device that includes a substrate including an emission region and a non-emission region, a buffer layer arranged on the substrate, a semiconductor layer arranged in the non-emission region on the buffer layer, a gate insulating layer arranged on an entire surface of the substrate, a first electrode arranged in the emission region on the gate insulating layer, a gate electrode arranged in the non-emission region on the gate insulating layer, an interlayer insulating layer arranged on the entire surface of the substrate and partially exposing the first electrode, source and drain electrodes arranged on the interlayer insulating layer and electrically connected to the semiconductor layer and the first electrode, a protection layer arranged on the entire surface of the substrate and partially exposing the first electrode, an organic layer arranged on the first electrode and a second electrode arranged on the entire surface of the substrate.

The first electrode can include a transparent conductive oxide (TCO)-based material. The gate insulating layer can include a plurality of layers that include a silicon oxide layer and a silicon nitride layer. The gate insulating layer can include a first silicon oxide layer, a silicon nitride layer, and a second silicon oxide layer sequentially stacked. Each of the first and second silicon oxide layers and the silicon nitride layer can have a thickness in the range of 300 to 500 Å. The buffer layer can be made out of $SiO_2$, $SiN_x$, $TiO_2$, $HfO_2$, $Al_2O_3$, $HfO_2$, $SiO_x$, $Ta_2O_5$, $Nb_2O_5$, $ZrO_2$, $Y_2O_3$, $La_2O_3$ or aluminum zinc oxide (AZO).

According to another aspect of the present invention, there is provided an organic light emitting diode (OLED) display device that includes a substrate including an emission region and a non-emission region, a buffer layer arranged on the substrate, a semiconductor layer arranged in the non-emission region on the buffer layer, a gate insulating layer arranged on an entire surface of the substrate, a first electrode arranged in the emission region on the gate insulating layer, a gate electrode arranged in the non-emission region on the gate insulating layer, an interlayer insulating layer arranged on the entire surface of the substrate and partially exposing the first electrode, source and drain electrodes arranged on the interlayer insulating layer and electrically connected to the semiconductor layer and the first electrode, a protection layer arranged on the entire surface of the substrate and partially exposing the first electrode, an organic layer arranged on the first electrode and a second electrode arranged on the entire surface of the substrate, wherein a contact layer is interposed between the first electrode and the source and drain electrodes. The first electrode can include comprised of a ZnO-based transparent conductive oxide material. The gate insulating layer can include a plurality of layers that include a silicon oxide layer and a silicon nitride layer. The gate insulating layer can include a first silicon oxide layer, a silicon nitride layer, and a second silicon oxide layer that are sequentially stacked. Each of the first and second silicon oxide layers and the silicon nitride layer can have a thickness in the range of 300 to 500 Å. The buffer layer can include one of $SiO_2$, $SiN_x$, $TiO_2$, $HfO_2$, $Al_2O_3$, $HfO_2$, $SiO_x$, $Ta_2O_5$, $Nb_2O_5$, $ZrO_2$, $Y_2O_3$, $La_2O_3$, and AZO. The gate electrode can be of a same material as the contact layer.

According to yet another aspect of the present invention, there is provided a method of fabricating an organic light emitting diode (OLED) display device, including providing a substrate including an emission region and a non-emission region, forming a buffer layer on the substrate, forming a semiconductor layer in the non-emission region on the buffer layer, forming a gate insulating layer on an entire surface of the substrate, forming a gate electrode on a region of the gate insulating layer that corresponds to the semiconductor layer, forming a first electrode in the non-emission region on the gate insulating layer, forming source and drain electrodes that are electrically connected to the semiconductor layer and the first electrode and electrically insulated from the gate electrode, forming an upper insulating layer on the entire surface of the substrate to expose the first electrode, forming an organic layer on the first electrode and forming a second electrode on the entire surface of the substrate.

An interlayer insulating layer can be formed between the source and drain electrodes and the gate electrode. The gate insulating layer can be a plurality of layers produced by stacking at least one silicon oxide layer and a silicon nitride layer. The gate insulating layer can be produced by sequentially stacking a first silicon oxide layer, a silicon nitride layer, and a second silicon oxide layer. Each of the first and second silicon oxide layers and the silicon nitride layer can have a thickness in the range of 300 to 500 Å. The first electrode can be a ZnO-based transparent conductive oxide material.

According to still another aspect of the present invention, there is provided an organic light emitting diode (OLED) display device that includes a substrate including an emission region and a non-emission region, a gate electrode arranged on the substrate, a gate insulating layer arranged on an entire surface of the substrate, a semiconductor layer arranged in the non-emission region on a region of the gate insulating layer that corresponds to the gate electrode, a first electrode arranged in the emission region on the gate insulating layer, source and drain electrodes arranged in the non-emission region and electrically connected to the semiconductor layer and the first electrode, a protection layer arranged on the entire surface of the substrate and partially exposing the first electrode, an organic layer arranged on the first electrode and a second electrode arranged on the entire surface of the substrate.

The first electrode can be a ZnO-based transparent conductive oxide material. The gate insulating layer can be a plurality of layers that includes at least one silicon oxide layer and a silicon nitride layer. The gate insulating layer can include a first silicon oxide layer, a silicon nitride layer, and a second silicon oxide layer that are sequentially stacked. Each of the first and second silicon oxide layers and the silicon nitride layer have a thickness in the range of 300 to 500 Å. The buffer layer can include one of $SiO_2$, $SiN_x$, $TiO_2$, $HfO_2$, $Al_2O_3$, $HfO_2$, $SiO_x$, $Ta_2O_5$, $Nb_2O_5$, $ZrO_2$, $Y_2O_3$, $La_2O_3$, and AZO.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicated the same or similar components, wherein:

FIGS. 1A through 1G are cross-sectional views illustrating a method of fabricating an organic light emitting diode (OLED) display device according to a first exemplary embodiment of the present invention;

FIGS. 2A through 2G are cross-sectional views illustrating a method of fabricating an OLED display device according to a second exemplary embodiment of the present invention;

FIGS. 6A through 6C are cross-sectional views illustrating a method of fabricating an OLED display device according to a third exemplary embodiment of the present invention.

DETAILED DESCRIPTION OF THE INVENTION

Figure 3:
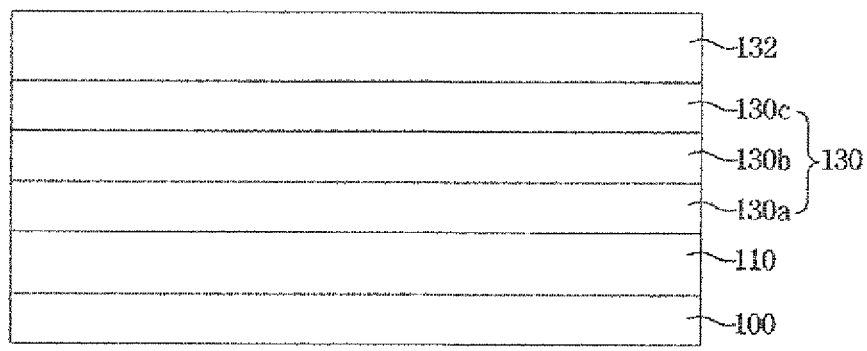
FIG. 3 is a diagram showing an experimental example of the present invention.

The present invention will be described more fully hereinafter with reference to the accompanying drawings, in which exemplary embodiments of the invention are shown. This invention can, however, be embodied in many different forms and should not be construed as being limited to the exemplary embodiments set forth herein.

It will also be understood that when a layer is referred to as being "on" another layer or substrate, it can be directly on the other layer or substrate, or intervening layers can also be present. Like reference numerals in the drawings denote like elements, and thus their description will be omitted.

Embodiment 1

FIGS. 1A through 1G are cross-sectional views illustrating a method of fabricating an organic light emitting diode (OLED) display device according to a first exemplary embodiment of the present invention.

Referring to FIG. 1A, a substrate 100 includes a pixel region "a" and a non-pixel region "b". A buffer layer 110 can be then formed on the substrate 100. The substrate 100 can be a transparent substrate made out of plastic or glass. The buffer layer 110 can prevent diffusion of moisture or impurities generated by the underlying substrate 100. The buffer layer 110 can be a single layer or a plurality of layers. The buffer layer 110 can be made out of an oxide layer or a nitride layer, such as a silicon oxide layer or a silicon nitride layer. The buffer layer 110 can further include $TiO_2$, $HfO_2$, $Al_2O_3$, $HfO_2$, $SiO_x$, $Ta_2O_5$, $Nb_2O_5$, $ZrO_2$, $Y_2O_3$, $La_2O_3$ or AZO.

Referring to FIG. 1B, a semiconductor layer 120 can be formed in the non-pixel region "b" on the buffer layer 110. The formation of the semiconductor layer 120 can include forming an amorphous silicon (a-Si) layer, crystallizing the a-Si layer into a polycrystalline silicon (poly-Si) layer or a single crystalline Si layer, and patterning the poly-Si layer or the single crystalline Si layer. In this case, the a-Si layer can be formed using a chemical vapor deposition (CVD) process or a physical vapor deposition (PVD) process. Also, a dehydrogenation process for lowering a hydrogen (H) concentration can be carried out during or after the formation of the a-Si layer. Although it is described above that the semiconductor layer 120 is a Si layer, the semiconductor layer 120 can instead be an oxide layer.

Thereafter, a gate insulating layer 130 can be formed on the entire surface of the substrate 100 having the semiconductor layer 120. The gate insulating layer 130 can be a single layer or a plurality of layers that includes at least one silicon oxide layer and at least one silicon nitride layer. The gate insulating layer 230 can further include $TiO_2$, $HfO_2$, $Al_2O_3$, $HfSiO_x$, $Ta_2O_5$, or $Nb_2O_5$.

The gate insulating layer 130 can be obtained by sequentially stacking a first silicon oxide layer, a silicon nitride layer, and a second silicon oxide layer. Each of the first and second silicon oxide layers and the silicon nitride layer can have a thickness of about 300 to 500 Å. In this case, a bottom-emitting OLED display device can maximize a resonance effect during an emission operation, thereby increasing luminous efficiency and color reproduction.

Referring to FIG. 1C, a first electrode 132 can be formed in the pixel region "a" on the gate insulating layer 130, and a gate electrode 135 can be formed in the non-pixel region "b" on a region of the gate insulating layer 130 corresponding to the semiconductor layer 120. In this case, the first electrode 132 and the gate electrode 135 can be produced at the same time.

The first electrode 132 can be made out of a transparent conductive material, such as indium tin oxide (ITO), or a ZnO-based transparent conductive oxide (TCO), such as indium zinc oxide (IZO), aluminum zinc oxide (AZO), or gallium zinc oxide (GZO). The first electrode 132 can have a thickness of about 300 to 500 Å.

Also, the formation of the gate electrode 135 can include forming a metal layer (not shown) for a gate electrode and etching the metal layer using photolithography and etching processes. The metal layer can be a single layer or multiple layers. The single layer can be made out of aluminum (Al) or an Al alloy, such as aluminum-neodymium (Al—Nd). The multiple layers can be obtained by stacking an Al alloy layer on a chrome (Cr) layer or a molybdenum (Mo) alloy layer.

The gate electrode 135 can be a double layer (not shown) that includes a lower layer and an upper layer. The lower layer can be a transparent conductive layer made out of ITO, IZO, AZO, or GZO, while the upper layer can be made out of Al, Al—Nd, Cr, or Mo. The transparent conductive layer serving as the lower layer can be formed simultaneously with the first electrode 132.

Referring to FIG. 1D, an interlayer insulating layer 140 can be formed on the entire surface of the substrate 100 and be partially etched, thereby forming contact holes 140a, 140b, and 140c partially exposing the semiconductor layer 120 and the first electrode 132.

Referring to FIG. 1E, source and drain electrodes 150a and 150b can be formed on the interlayer insulating layer 140 and be connected to the semiconductor layer 120 and the first electrode 132 through the contact holes 140a, 140b, and 140c. The source and drain electrodes 150a and 150b can be made out of molybdenum (Mo), chrome (Cr), tungsten (W), molybdenum-tungsten (MoW), aluminum (Al), aluminum-neodymium (Al—Nd), titanium (Ti), titanium nitride (TiN), copper (Cu), a Mo alloy, an Al alloy, or a Cu alloy.

Referring to FIG. 1F, a protection layer 160 can be formed on the entire surface of the substrate 100. Thereafter, the interlayer insulating layer 140 and the protection layer 160 can be partially removed to partially expose the first electrode 132 in the pixel region "a".

Referring to FIG. 1G, an organic layer 170 including an organic emission layer (EML) can be formed on the exposed first electrode 132, and a second electrode 180 can be formed on the entire surface of the substrate 100, thereby completing fabrication of the OLED display device.

Embodiment 2

Turning to FIGS. 2A through 2G, FIGS. 2A through 2G are cross-sectional views illustrating a method of fabricating an OLED display device according to a second exemplary embodiment of the present invention. The second exemplary embodiment is the same as the first exemplary embodiment except that a contact layer 235a is further formed between source and drain electrodes and a first electrode. Thus, repeated descriptions will be omitted for brevity.

Referring to FIG. 2A, a substrate 200 including a pixel region "a" and a non-pixel region "b" can be prepared, and a buffer layer 210 can be then formed on the substrate 200. The substrate 200 can be a transparent substrate made out of plastic or glass. The buffer layer 210 can prevent diffusion of moisture or impurities generated by the underlying substrate 200. The buffer layer 210 can be a single layer or a plurality of layers. The buffer layer 210 can be an oxide layer or a nitride layer, such as a silicon oxide layer or a silicon nitride layer. The buffer layer 210 can further include $TiO_2$, $HfO_2$, $Al_2O_3$, $HfSiO_x$, $Ta_2O_5$, or $Nb_2O_5$.

Referring to FIG. 2B, a semiconductor layer 220 can be formed in the non-pixel region "b" and on the buffer layer 210. The formation of the semiconductor layer 220 can include forming an a-Si layer, crystallizing the a-Si layer into a poly-Si layer or a single crystalline Si layer, and patterning the poly-Si layer or the single crystalline Si layer.

Also, a gate insulating layer 230 can then be formed on the entire surface of the substrate 200. The gate insulating layer 230 can be an oxide layer or a nitride layer, such as a tri-silicon oxide layer or silicon nitride layer. The gate insulating layer 230 can further include $TiO_2$, $HfO_2$, $Al_2O_3$, $HfSiO_x$, $Ta_2O_5$, or $Nb_2O_5$.

Referring to FIG. 2C, a first electrode 232 can be formed in the pixel region "a" on the gate insulating layer 230. Afterwards, a contact layer 235a can be formed on the first electrode 232, and a gate electrode 235 can be formed in the non-pixel region "b" on a region of the gate insulating layer 230 corresponding to the semiconductor layer 220.

The gate electrode 235 can be a double layer (not shown) including a lower layer and an upper layer. The lower layer can be a transparent conductive layer made out of ITO, IZO, AZO, or GZO, while the upper layer can be made out of Al, Al—Nd, Cr, or Mo. The transparent conductive layer serving as the lower layer can be formed simultaneously with the first electrode 232.

In this case, the first electrode 232 can be made out of a transparent conductive material such as ITO, or a ZnO-based TCO such as IZO, AZO, or GZO. The first electrode 232 can have a thickness of about 300 to 500 Å.

Also, the formation of the contact layer 235a and the gate electrode 235 can include forming a metal layer (not shown) for a gate electrode and etching the metal layer using photolithography and etching processes. The metal layer can be a single layer or a plurality of layers. The single layer can be made out of Al or an Al alloy, such as Al—Nd. The multiple layers can be obtained by stacking an Al alloy layer on a Cr layer or a Mo alloy layer.

Referring to FIG. 2D, an interlayer insulating layer 240 can be formed on the entire surface of the substrate 200 and then be partially etched, thereby forming contact holes 240a, 240b, and 240c to partially expose the contact layer 235a and the semiconductor layer 220.

Referring to FIG. 2E, source and drain electrodes 250a and 250b can be formed such that the semiconductor layer 220 can be electrically connected to the first electrode 232 through the contact holes 240a, 240b, and 240c.

The contact layer 235a can be interposed between the source and drain electrodes 250a and 250b and the first electrode 232 to reduce a contact resistance.

Referring to FIG. 2F, a protection layer 260 can be formed on the entire surface of the substrate 200. Thereafter, the interlayer insulating layer 240 and the protection layer 260 can be etched to partially expose the first electrode 232.

Referring to FIG. 2G, an organic layer 270 including an organic EML can be formed on the exposed first electrode 232, and a second electrode 280 can be formed on the entire surface of the substrate 200, thereby completing fabrication of the OLED display device.

Although fabrication of an OLED display device can be completed according to the above-described exemplary embodiments, the present invention is not limited thereto, and a combination of well known techniques can instead be applied.

Hereinafter, experimental examples and comparative examples in which the color coordinates and luminances of red (R), green (G), and blue (B) EMLs were measured by changing the condition of the gate insulating layer 130 according to Embodiment 1 will be described. The following experimental examples 1 through 3 and comparative examples 1 through 3 will be described with reference to Embodiment 1, and repeated descriptions will be omitted for brevity.

Turning to FIG. 3, FIG. 3 is a cross-sectional view of a detailed structure of the gate insulating layer of FIG. 1B, which is formed in the pixel region according to Embodiment 1. The following experimental examples 1 through 3 and comparative examples 1 through 3 will be described with reference to FIG. 3.

Referring to FIG. 3, a buffer layer 110 can be disposed on a substrate 100. A gate insulating layer 130 can be disposed on the buffer layer 110. The gate insulating layer 130 can include a first silicon oxide layer 130a, a silicon nitride layer 130b, and a second silicon oxide layer 130c which are sequentially stacked. A first electrode 132 made out of ITO can be disposed on the gate insulating layer 130.

Experimental Example 1

A buffer layer 110 was formed on a substrate 100. A first silicon oxide layer 130a, a silicon nitride layer 130b, and a second silicon oxide layer 130c were sequentially stacked on the buffer layer 110 to form a gate insulating layer 130. Each of the first and second silicon oxide layers 130a and 130c was formed to a thickness of about 300 Å, and the silicon nitride layer 130b was formed to a thickness of about 500 Å. Afterwards, a first electrode 132 of ITO was formed on the gate insulating layer 130.

Experimental Example 2

A buffer layer 110 was formed on a substrate 100. A first silicon oxide layer 130a, a silicon nitride layer 130b, and a second silicon oxide layer 130c were sequentially stacked on the buffer layer 110 to form a gate insulating layer 130. The first silicon oxide layer 130a was formed to a thickness of about 300 Å, the silicon nitride layer 130b was formed to a thickness of about 500 Å, and the second silicon oxide layer 130c was formed to a thickness of about 400 Å. Afterwards, a first electrode 132 of ITO was formed on the gate insulating layer 130.

Experimental Example 3

A buffer layer 110 was formed on a substrate 100. A first silicon oxide layer 130a, a silicon nitride layer 130b, and a second silicon oxide layer 130c were sequentially stacked on the buffer layer 110 to form a gate insulating layer 130. The first silicon oxide layer 130a was formed to a thickness of about 300 Å, the silicon nitride layer 130b was formed to a thickness of about 500 Å, and the second silicon oxide layer 130c was formed to a thickness of about 500 Å. Afterwards, a first electrode 132 of ITO was formed on the gate insulating layer 130.

Experimental Example 4

A buffer layer 110 was formed on a substrate 100. A first silicon oxide layer 130a, a silicon nitride layer 130b, and a second silicon oxide layer 130c were sequentially stacked on the buffer layer 110 to form a gate insulating layer 130. The first silicon oxide layer 130a was formed to a thickness of about 300 Å, the silicon nitride layer 130b was formed to a thickness of about 300 Å, and the second silicon oxide layer 130c was formed to a thickness of about 500 Å. Afterwards, a first electrode 132 of ITO was formed on the gate insulating layer 130.

Experimental Example 5

A buffer layer 110 was formed on a substrate 100. A first silicon oxide layer 130a, a silicon nitride layer 130b, and a second silicon oxide layer 130c were sequentially stacked on the buffer layer 110 to form a gate insulating layer 130. The first silicon oxide layer 130a was formed to a thickness of about 300 Å, the silicon nitride layer 130b was formed to a thickness of about 400 Å, and the second silicon oxide layer 130c was formed to a thickness of about 500 Å. Afterwards, a first electrode 132 of ITO was formed on the gate insulating layer 130.

Comparative Example 1

A buffer layer 110 was formed on a substrate 100. A first silicon oxide layer 130a, a silicon nitride layer 130b, and a second silicon oxide layer 130c were sequentially stacked on the buffer layer 110 to form a gate insulating layer 130. The first silicon oxide layer 130a was formed to a thickness of about 300 Å, the silicon nitride layer 130b was formed to a thickness of about 500 Å, and the second silicon oxide layer 130c was formed to a thickness of about 200 Å. Afterwards, a first electrode 132 of ITO was formed on the gate insulating layer 130.

Comparative Example 2

A buffer layer 110 was formed on a substrate 100. A first silicon oxide layer 130a, a silicon nitride layer 130b, and a second silicon oxide layer 130c were sequentially stacked on the buffer layer 110 to form a gate insulating layer 130. The first silicon oxide layer 130a was formed to a thickness of about 300 Å, the silicon nitride layer 130b was formed to a thickness of about 500 Å, and the second silicon oxide layer 130c was formed to a thickness of about 600 Å. Afterwards, a first electrode 132 of ITO was formed on the gate insulating layer 130.

Comparative Example 3

A buffer layer 110 was formed on a substrate 100. A first silicon oxide layer 130a, a silicon nitride layer 130b, and a second silicon oxide layer 130c were sequentially stacked on the buffer layer 110 to form a gate insulating layer 130. The first silicon oxide layer 130a was formed to a thickness of about 300 Å, the silicon nitride layer 130b was formed to a thickness of about 500 Å, and the second silicon oxide layer 130c was formed to a thickness of about 700 Å. Afterwards, a first electrode 132 of ITO was formed on the gate insulating layer 130.

Comparative Example 4

A buffer layer 110 was formed on a substrate 100. A first silicon oxide layer 130a, a silicon nitride layer 130b, and a second silicon oxide layer 130c were sequentially stacked on the buffer layer 110 to form a gate insulating layer 130. The first silicon oxide layer 130a was formed to a thickness of about 300 Å, the silicon nitride layer 130b was formed to a thickness of about 200 Å, and the second silicon oxide layer 130c was formed to a thickness of about 500 Å. Afterwards, a first electrode 132 of ITO was formed on the gate insulating layer 130.

Comparative Example 5

A buffer layer 110 was formed on a substrate 100. A first silicon oxide layer 130a, a silicon nitride layer 130b, and a second silicon oxide layer 130c were sequentially stacked on the buffer layer 110 to form a gate insulating layer 130. The first silicon oxide layer 130a was formed to a thickness of about 300 Å, the silicon nitride layer 130b was formed to a thickness of about 600 Å, and the second silicon oxide layer 130c was formed to a thickness of about 500 Å. Afterwards, a first electrode 132 of ITO was formed on the gate insulating layer 130.

Comparative Example 6

A buffer layer 110 was formed on a substrate 100. A first silicon oxide layer 130a, a silicon nitride layer 130b, and a second silicon oxide layer 130c were sequentially stacked on the buffer layer 110 to form a gate insulating layer 130. The first silicon oxide layer 130a was formed to a thickness of about 300 Å, the silicon nitride layer 130b was formed to a thickness of about 700 Å, and the second silicon oxide layer 130c was formed to a thickness of about 500 Å. Afterwards, a first electrode 132 of ITO was formed on the gate insulating layer 130.

Figure 4A:
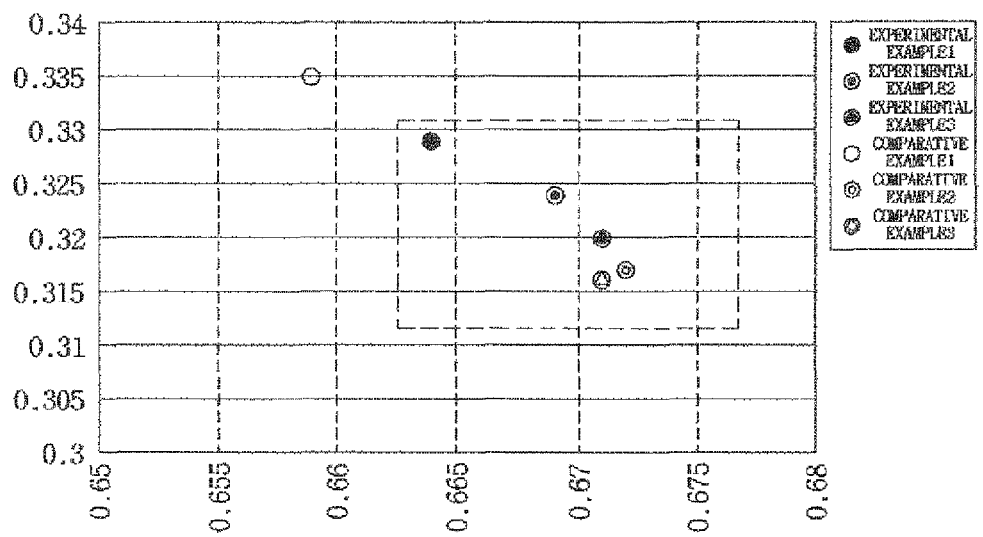
FIGS. 4A through 5D are graphs of results showing a comparison of experimental examples of the present invention and comparative examples.
Figure 4B:
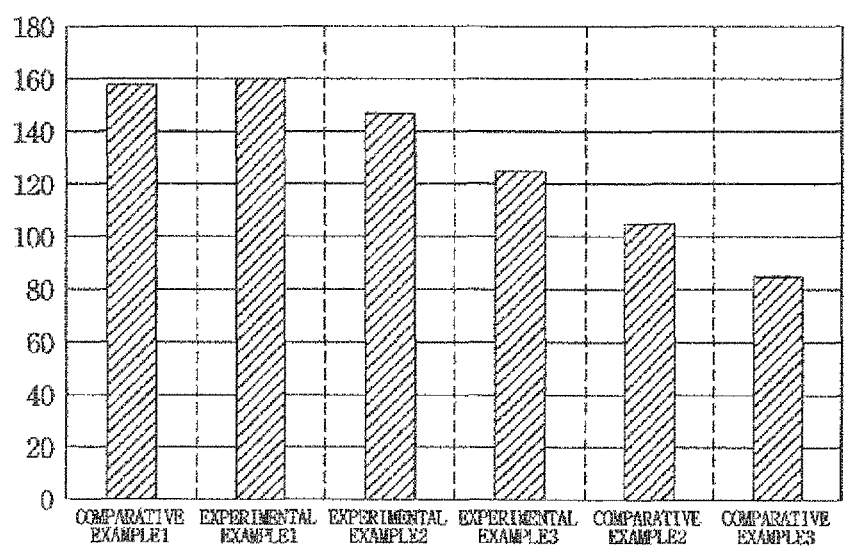
Figure 4C:
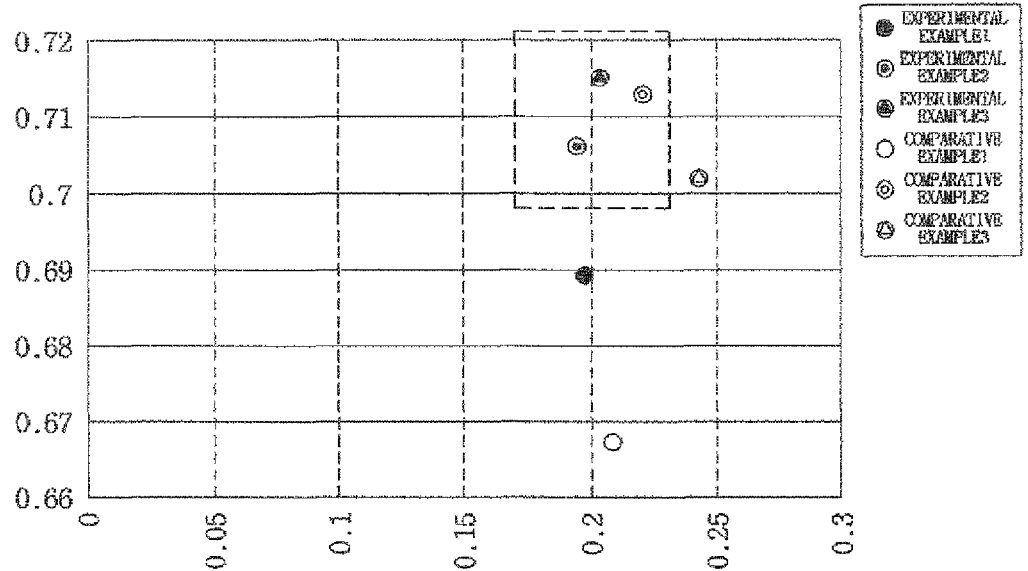
Figure 4D:
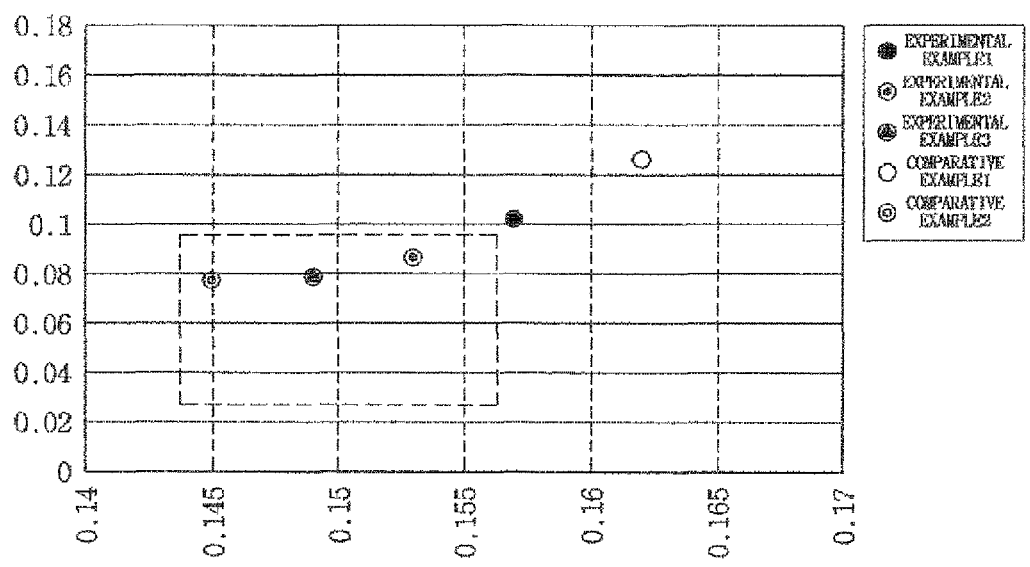

Turning now to FIGS. 4A through 4D, FIGS. 4A through 4D are graphs of color coordinates and luminances relative to the thickness of the second silicon oxide layer 130c of the gate insulating layer 130, which is in direct contact with the first electrode 132. FIGS. 4A and 4B are graphs of the color coordinates and luminances of an R EML, FIG. 4C is a graph of the color coordinate of a G EML, and FIG. 4D is a graph of the color coordinate of a B EML.

Referring to FIG. 4A, in the case of Comparative example 1 where the second silicon oxide layer 130c was formed to a thickness of about 200 Å, R-light emission departed from desirable color coordinates. Also, in Comparative example 2 where the second silicon oxide layer 130c was formed to a thickness of about 600 Å and in Comparative example 3 where the second silicon oxide layer 130c was formed to a thickness of about 700 Å, R-light emission was enabled. However, referring to FIG. 4B, it can be seen that the luminances of the R EML in Comparative examples 2 and 3 was markedly reduced.

Referring to FIG. 4C, in Experimental examples 1 through 3 and Comparative example 2 where the second silicon oxide layer 130c was formed to a thickness of about 300 Å, 400 Å, 500 Å, and 600 Å, respectively, G-light emission was effectively attained. Referring to FIG. 4D, in Experimental examples 1 through 3 and Comparative example 2 where the second silicon oxide layer 130c was formed to a thickness of about 300 Å, 400 Å, 500 Å, and 600 Å, respectively, B-light emission was desirably realized.

Therefore, the second silicon oxide layer 130c can be formed to a thickness of about 300 to 500 Å in order to maximize the effects of R-light emission, G-light emission, and B-light emission.

Figure 5A:
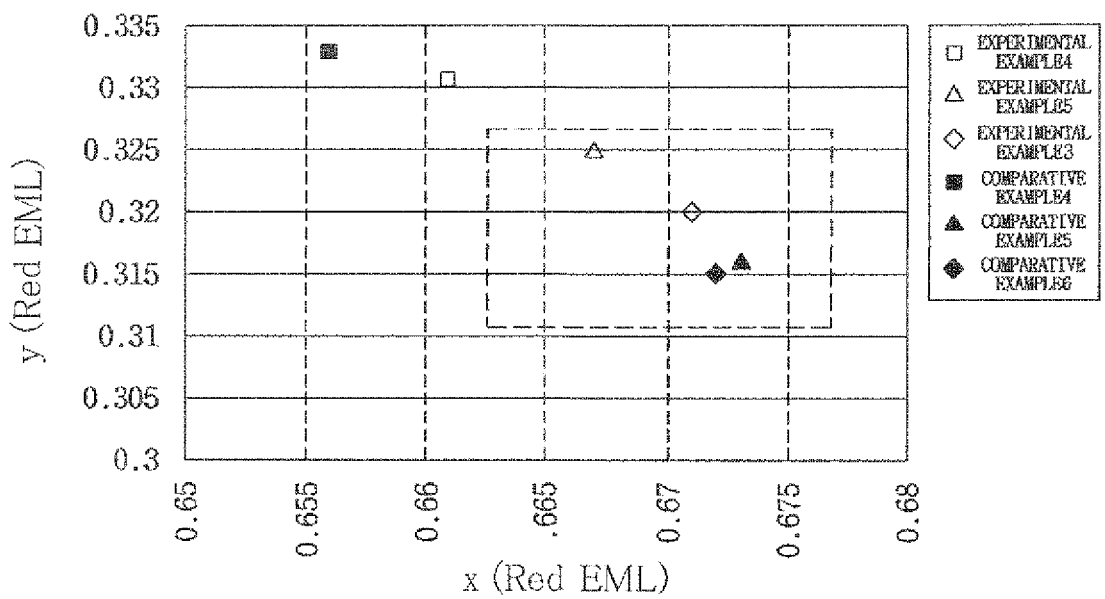
Figure 5B:
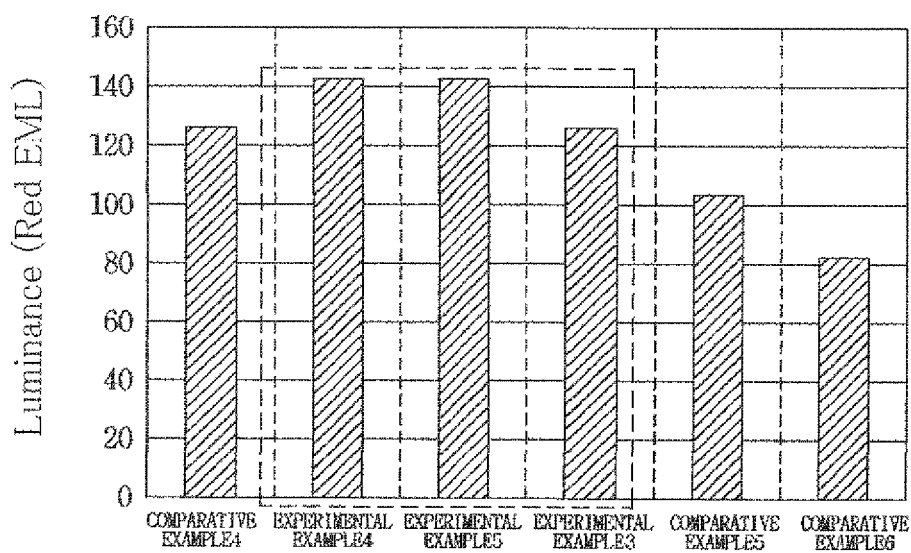
Figure 5C:
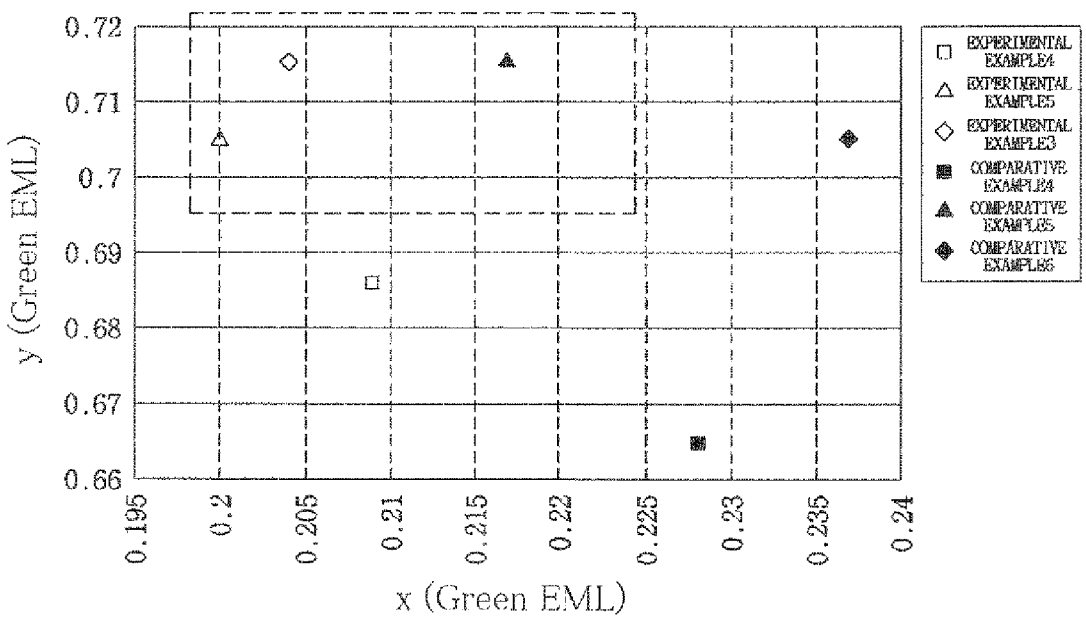
Figure 5D:
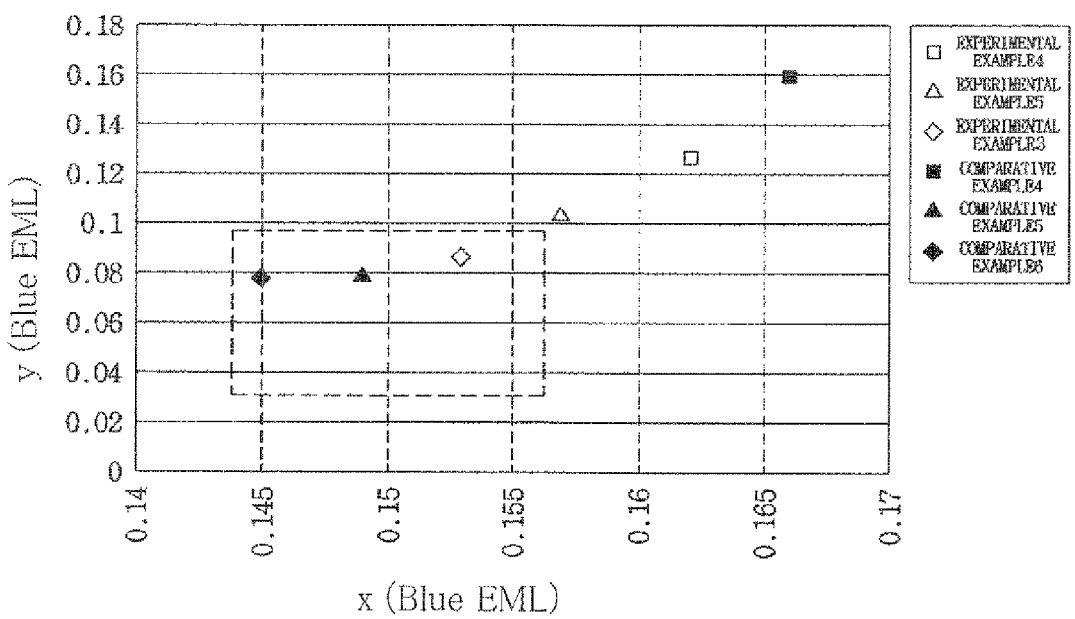

FIGS. 5A through 5D are graphs of color coordinates and luminances of R, G, and B EMLs relative to the thickness of the silicon nitride layer 130b. FIGS. 5A and 5B are graphs of the color coordinates and luminances of the R EML, FIG. 5C is a graph of the color coordinate of the G EML, and FIG. 5D is a graph of the color coordinate of the B EML.

Referring to FIG. 5A, in Comparative example 4 where the silicon nitride layer 130b was formed to a thickness of about 200 Å, R-light emission departed from desirable color coordinates. Also, in Comparative example 5 where the silicon nitride layer 130b was formed to a thickness of about 600 Å and in Comparative example 6 where the silicon nitride layer 130b was formed to a thickness of about 700 Å, R-light emission was enabled. However, referring to FIG. 5B, it can be seen that the luminances of the R EML in Comparative examples 5 and 6 was markedly reduced.

Referring to FIG. 5C, in Experimental examples 5 and 3 and Comparative example 5 where the silicon nitride layer 130b was formed to a thickness of about 400 Å, 500 Å, and 600 Å, respectively, G-light emission was effectively attained. Referring to FIG. 5D, in Experimental example 3 and Comparative example 5 where the silicon nitride layer 130b was formed to a thickness of about 500 Å and 600 Å, respectively, B-light emission was desirably realized.

Therefore, it can be concluded that when the silicon nitride layer 130c was formed to a thickness of about 300 to 500 Å, R-light emission, G-light emission, and B-light emission could be embodied most effectively.

Embodiment 3

The present exemplary embodiment describes a bottom-gate-type OLED display device in which a gate electrode is formed under a semiconductor layer. Thus, the present exemplary embodiment is the same as Embodiment 1, which describes a top-gate-type OLED display device, except for the position of the gate electrode. Thus, a repeated description will be omitted for brevity.

Figure 6C:
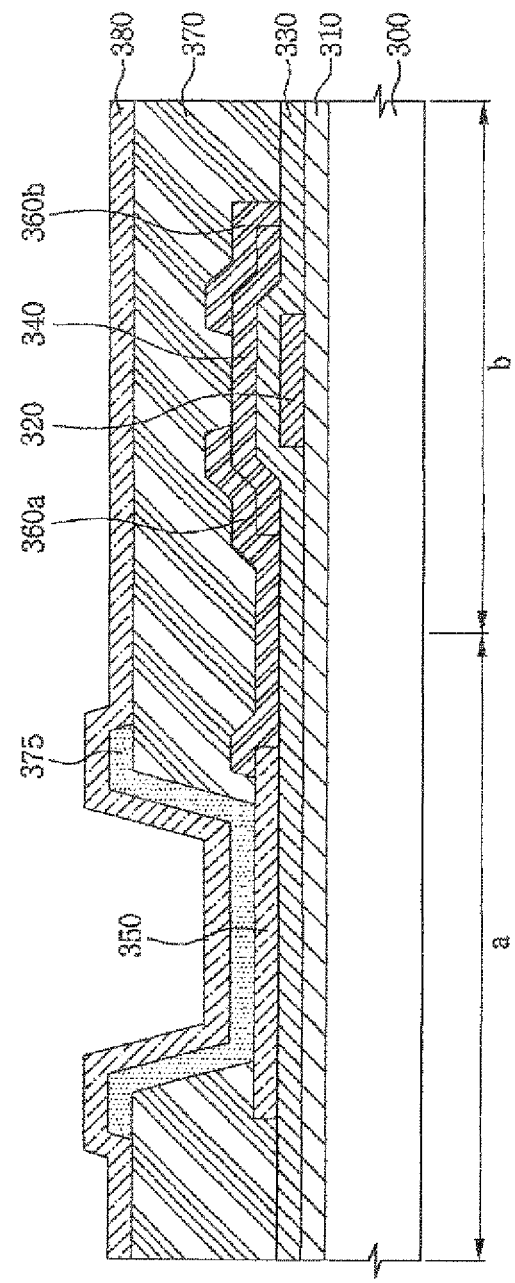

Turning now to FIGS. 6A through 6C, FIGS. 6A through 6C are cross-sectional views illustrating a method of fabricating an OLED display device according to a third exemplary embodiment of the present invention.

Referring to FIG. 6A, a substrate 300 including a pixel region "a" and a non-pixel region "b" can be provided. A buffer layer 310 can be formed on the substrate 300, and a gate electrode 320 can be formed on the buffer layer 310. The gate electrode 320 can be formed in the non-pixel region "b".

Thereafter, a gate insulating layer 330 can be formed on the entire surface of the substrate 300. A first electrode 350 can be formed in the pixel region "a" on the gate insulating layer 330, and a semiconductor layer 340 can be formed in the non-pixel region "b" on a region of the gate insulating layer 330 corresponding to the gate electrode 320. The substrate 300, the buffer layer 310, the semiconductor layer 340, the gate insulating layer 330, and the first electrode 350 can be formed in the same manner as described in Embodiment 1.

Referring to FIG. 6B, source and drain electrodes 360a and 360b can be formed over the substrate 300 so that the first electrode 350 can be electrically connected to the semiconductor layer 340. Although the present embodiment describes that the source and drain electrodes 360a and 360b are formed directly on the first electrode 350, an insulating layer can be further formed between the source and drain electrodes 360a and 360b and the first electrode 350, and contact holes can be formed in the insulating layer so that the first electrode 350 can be electrically connected to the source and drain electrodes 360a and 360b.

As described in Embodiment 1, the gate electrode 350 can be a single layer or have a double layer. The single layer can be made out of a metal for a gate electrode. The double layer can include a lower layer made out of the same material as the first electrode 350 and an upper layer made out of a material for a gate electrode.

Referring to FIG. 6C, a protection layer 370 can be formed on the substrate 300 having the source and drain electrodes 360a and 360b. The protection layer 370 can partially expose the first electrode 350 to define a pixel.

Subsequently, an organic layer 375 including an organic EML can be formed on the exposed first electrode 350. Thereafter, a second electrode 380 can be formed on the entire surface of the substrate 300, thereby completing fabrication of the OLED display device.

As described above, the color reproduction and luminance of a bottom-emitting OLED display device can depend on the material and thickness of a gate insulating layer disposed under a first electrode. Thus, the gate insulating layer should be made out of an appropriate material to an appropriate thickness in order to effectively embody R-, G-, and B-light emission.

According to the present invention as described above, an OLED display device and a method of fabricating the same can maximize a resonance effect during an emission operation, thereby increasing luminous efficiency and color reproduction during a bottom or double-sided emission operation.

Although the present invention has been described with reference to certain exemplary embodiments thereof, it will be understood by those skilled in the art that a variety of modifications and variations can be made to the present invention without departing from the spirit or scope of the present invention defined in the appended claims, and their equivalents.

What is claimed is:

1. An organic light emitting diode (OLED) display device, comprising:
a substrate including an emission region and a non-emission region;
a buffer layer arranged on the substrate;
a semiconductor layer arranged in the non-emission region on the buffer layer;
a gate insulating layer arranged on an entire surface of the substrate;
a first electrode arranged in the emission region and directly on the gate insulating layer;
a gate electrode arranged in the non-emission region on the gate insulating layer;
an interlayer insulating layer arranged on the entire surface of the substrate and partially exposing the first electrode;
source and drain electrodes arranged on the interlayer insulating layer and electrically connected to the semiconductor layer and the first electrode;
a protection layer arranged on the entire surface of the substrate and partially exposing the first electrode;
an organic layer arranged on the first electrode; and
a second electrode arranged on the entire surface of the substrate.

2. The display device of claim 1, wherein the first electrode is composed of a transparent conductive oxide (TCO)-based material selected from a group consisting of indium tin oxide, indium zinc oxide, aluminum zinc oxide and gallium zinc oxide.

3. The display device of claim 1, wherein the gate insulating layer is comprised of a plurality of layers that include a silicon oxide layer and a silicon nitride layer.

4. The display device of claim 1, wherein the gate insulating layer includes a first silicon oxide layer, a silicon nitride layer, and a second silicon oxide layer sequentially stacked.

5. The display device of claim 4, wherein each of the first and second silicon oxide layers and the silicon nitride layer have a thickness in the range of 300 to 500 Å.

6. The display device of claim 1, wherein the buffer layer is a single layer or multiple layers.

7. The display device of claim 1, wherein the buffer layer comprises one compound selected from a group consisting of $SiO_2$, $SiN_x$, $TiO_2$, $HfO_2$, $Al_2O_3$, $HfO_2$, $SiO_x$, $Ta_2O_5$, $Nb_2O_5$, $ZrO_2$, $Y_2O_3$, $La_2O_3$, and aluminum zinc oxide (AZO).

8. An organic light emitting diode (OLED) display device, comprising:
a substrate including an emission region and a non-emission region;
a buffer layer arranged on the substrate;
a semiconductor layer arranged in the non-emission region on the buffer layer;
a gate insulating layer arranged on an entire surface of the substrate;
a first electrode arranged in the emission region and directly on the gate insulating layer;
a gate electrode arranged in the non-emission region on the gate insulating layer;
an interlayer insulating layer arranged on the entire surface of the substrate and partially exposing the first electrode;
source and drain electrodes arranged on the interlayer insulating layer and electrically connected to the semiconductor layer and the first electrode;
a protection layer arranged on the entire surface of the substrate and partially exposing the first electrode;
an organic layer arranged on the first electrode; and
a second electrode arranged on the entire surface of the substrate,
wherein a contact layer is interposed between the first electrode and the source and drain electrodes.

9. The display device of claim 8, wherein the first electrode is composed of a transparent conductive oxide (TCO)-based material selected from a group consisting of indium tin oxide, oxide aluminum zinc oxide and gallium zinc oxide.

10. The display device of claim 8, wherein the gate insulating layer is comprised of a plurality of layers that include a silicon oxide layer and a silicon nitride layer.

11. The display device of claim 8, wherein the gate insulating layer includes a first silicon oxide layer, a silicon nitride layer, and a second silicon oxide layer that are sequentially stacked.

12. The display device of claim 11, wherein each of the first and second silicon oxide layers and the silicon nitride layer have a thickness in the range of 300 to 500 Å.

13. The display device of claim 8, wherein the buffer layer is a single layer or multiple layers.

14. The display device of claim 8, wherein the buffer layer includes one compound selected from a group consisting of $SiO_2$, $SiN_x$, $TiO_2$, $HfO_2$, $Al_2O_3$, $HfO_2$, $SiO_x$, $Ta_2O_5$, $Nb_2O_5$, $ZrO_2$, $Y_2O_3$, $La_2O_3$, and AZO.

15. The display device of claim 8, wherein the gate electrode is comprised of a same material as the contact layer.

16. A method of fabricating an organic light emitting diode (OLED) display device, comprising:
 providing a substrate including an emission region and a non-emission region;
 forming a buffer layer on the substrate;
 forming a semiconductor layer in the non-emission region on the buffer layer;
 forming a gate insulating layer on an entire surface of the substrate;
 forming a gate electrode on a region of the gate insulating layer that corresponds to the semiconductor layer;
 forming a first electrode in the non-emission region and directly on the gate insulating layer;
 forming source and drain electrodes that are electrically connected to the semiconductor layer and the first electrode and electrically insulated from the gate electrode;
 forming an upper insulating layer on the entire surface of the substrate to expose the first electrode;
 forming an organic layer on the first electrode; and
 forming a second electrode on the entire surface of the substrate.

17. The method of claim 16, wherein an interlayer insulating layer is formed between the source and drain electrodes and the gate electrode.

18. The method of claim 16, wherein the gate insulating layer is comprised of a plurality of layers produced by stacking at least one silicon oxide layer and a silicon nitride layer.

19. The method of claim 16, wherein the gate insulating layer is produced by sequentially stacking a first silicon oxide layer, a silicon nitride layer, and a second silicon oxide layer.

20. The method of claim 18, wherein each of the first and second silicon oxide layers and the silicon nitride layer have a thickness in the range of 300 to 500 Å.

21. The method of claim 16, wherein the first electrode is composed of a transparent conductive oxide (TCO)-based material selected from a group consisting of indium tin oxide, indium zinc oxide, aluminum zinc oxide and gallium zinc oxide.

22. An organic light emitting diode (OLED) display device, comprising:
 a substrate including an emission region and a non-emission region;
 a gate electrode arranged on the substrate;
 a gate insulating layer arranged on an entire surface of the substrate;
 a semiconductor layer arranged in the non-emission region on a region of the gate insulating layer that corresponds to the gate electrode;
 a first electrode arranged in the emission region and directly on the gate insulating layer;
 source and drain electrodes arranged in the non-emission region and electrically connected to the semiconductor layer and the first electrode;
 a protection layer arranged on the entire surface of the substrate and partially exposing the first electrode;
 an organic layer arranged on the first electrode; and
 a second electrode arranged on the entire surface of the substrate.

23. The display device of claim 22, wherein the first electrode is composed of a transparent conductive oxide (TCO)-based material selected from a group consisting of indium tin oxide, indium zinc oxide, aluminum zinc oxide and gallium zinc oxide.

24. The display device of claim 22, wherein the gate insulating layer is comprised of a plurality of layers that includes at least one silicon oxide layer and a silicon nitride layer.

25. The display device of claim 24, wherein the gate insulating layer includes a first silicon oxide layer, a silicon nitride layer, and a second silicon oxide layer that are sequentially stacked.

26. The display device of claim 25, wherein each of the first and second silicon oxide layers and the silicon nitride layer have a thickness in the range of 300 to 500 Å.

27. The display device of claim 22, wherein the buffer layer is a single layer or multiple layers.

28. The display device of claim 22, wherein the buffer layer includes a compound selected from a group consisting of $SiO2$, $SiO_2$, $SiN_x$, $TiO_2$, $HfO_2$, $Al_2O_3$, $HfO_2$, $SiO_x$, $Ta_2O_5$, $Nb_2O_5$, $ZrO_2$, $Y_2O_3$, $La_2O_3$, and aluminum zinc oxide (AZO).

* * * * *